(12) United States Patent
Lu et al.

(10) Patent No.: US 9,076,900 B2
(45) Date of Patent: Jul. 7, 2015

(54) SOLAR CELL MODULE AND SOLAR CELL

(75) Inventors: Mike Lu, New Taipei (TW); Cheng-Yi Chiang, Kaohsiung (TW); Bao-Shun Yau, Kaohsiung (TW)

(73) Assignee: Industrial Technology Research Institute, Hsinchu (TW)

(*) Notice: Subject to any disclaimer, the term of this patent is extended or adjusted under 35 U.S.C. 154(b) by 917 days.

(21) Appl. No.: 13/287,138

(22) Filed: Nov. 2, 2011

(65) Prior Publication Data
US 2012/0279545 A1 Nov. 8, 2012

Related U.S. Application Data

(60) Provisional application No. 61/482,636, filed on May 5, 2011.

(51) Int. Cl.
*H01L 31/0216* (2014.01)
*H01L 31/0465* (2014.01)

(52) U.S. Cl.
CPC .......... *H01L 31/02167* (2013.01); *Y02E 10/50* (2013.01); *H01L 31/0465* (2014.12)

(58) Field of Classification Search
CPC ... H01L 31/00; H01L 31/02; H01L 31/02021; H01L 31/0201; H01L 31/0224; H01L 31/022433; H01L 31/0352; H01L 31/035281; H01L 31/042; H01L 31/05; H01L 31/022425
See application file for complete search history.

(56) References Cited

U.S. PATENT DOCUMENTS

| | | | |
|---|---|---|---|
| 6,262,358 B1 | 7/2001 | Kamimura et al. | |
| 6,620,645 B2 | 9/2003 | Chandra et al. | |
| 7,678,990 B2 | 3/2010 | McCaskill et al. | |
| 2001/0015221 A1* | 8/2001 | Kubota et al. | 136/256 |
| 2008/0216886 A1 | 9/2008 | Iwakura | |
| 2008/0241356 A1 | 10/2008 | Fu et al. | |
| 2010/0031995 A1 | 2/2010 | Herner et al. | |

FOREIGN PATENT DOCUMENTS

| | | |
|---|---|---|
| TW | I239657 | 9/2005 |
| TW | 200840068 | 10/2008 |

OTHER PUBLICATIONS

Chih-Yu Chang et al., "Efficient and air-stable plastics-based polymer solar cells enabled by atomic layer deposition", Journal of Materials Chemistry, 2011, p. 5710-p. 5715.
Seungchan Han et al., "Versatile Multilayer Transparent Electrodes for ITO-Free and Flexible Organic Solar Cells", IEEE Journal of Selected Topics in Quantum Electronics, vol. 16 No. 6 Nov./Dec. 2010, p. 1656-p. 1664.
Jin-A Jeong et al., "Low resistance and highly transparent ITO-Ag-ITO multilayer electrode using surface plasmon resonance of Ag layer for bulk-heterojunction organic solar cells", Solar Energy Materials & Solar Cells 93, 2009, p. 1801-p. 1809.

* cited by examiner

*Primary Examiner* — Christina Chern
(74) *Attorney, Agent, or Firm* — Jianq Chyun IP Office

(57) ABSTRACT

A solar cell module is described, including a series of solar cells each including a bottom electrode, a photoelectric conversion layer, an insulating pattern, a top electrode layer and a passivation layer. The conversion layer is on the bottom electrode and also on the substrate at a first side of the bottom electrode. The insulating pattern is on the bottom electrode, covering an edge portion of the conversion layer near a second side of the bottom electrode. The top electrode layer is on the conversion layer and adjacent to the insulating pattern. The passivation layer is on the top electrode layer and adjacent to the insulating pattern, wherein the top of the passivation layer on the top electrode layer is lower than the top of the insulating pattern. The bottom electrode of a solar cell is electrically connected with the top electrode layer of an adjacent solar cell.

17 Claims, 1 Drawing Sheet

SOLAR CELL MODULE AND SOLAR CELL

CROSS-REFERENCE TO RELATED APPLICATION

This application claims the priority benefits of U.S. provisional application Ser. No. 61/482,636, filed on May 05, 2011. The entirety of the above-mentioned patent applications is hereby incorporated by reference herein and made a part of this specification.

BACKGROUND

1. Technical Field

This disclosure relates to a solar cell module, and a solar cell that can serve as a constituting unit of the solar cell module.

2. Related Art

A solar cell typically includes a bottom electrode, a top electrode and a photoelectric conversion layer between them. A type of solar cell module includes a number of solar cells arranged in a series, wherein the bottom electrode of a solar cell is electrically connected with the top electrode of an adjacent solar cell.

In the manufacturing of a thin-film solar cell, each of the bottom electrode, the photoelectric conversion layer and the top electrode is formed with a deposition process and a subsequent patterning process that patterns the deposited layer. The patterning process takes a certain period of time and has certain issues to care.

SUMMARY

Accordingly, this disclosure provides a structure of a solar cell module.

This disclosure also provides a structure of a solar cell as a constituting unit of the solar cell module of this disclosure.

The solar cell module of this disclosure includes a plurality of solar cells arranged in a series on a substrate. Each solar cell includes a bottom electrode, a photoelectric conversion layer, an insulating pattern, a top electrode layer and a passivation layer. The photoelectric conversion layer is on the bottom electrode and also on the substrate at a first side of the bottom electrode. The insulating pattern is on the bottom electrode, covering an edge portion of the photoelectric conversion layer near a second side of the bottom electrode. The top electrode layer is on the photoelectric conversion layer and adjacent to the insulating pattern. The passivation layer is on the top electrode layer and adjacent to the insulating pattern, wherein the top of the passivation layer on the top electrode layer is lower than the top of the insulating pattern. In the solar cell module, the bottom electrode of a solar cell is electrically connected with the top electrode layer of an adjacent solar cell.

By disposing a sufficiently thick insulating pattern on the bottom electrode of each solar cell, the films deposited subsequently, which include the film for forming the top electrodes, are divided by the insulating patterns as deposited and are not needed to pattern, so the manufacture of the solar cell module is simplified.

In order to make the aforementioned and other features of this disclosure comprehensible, a preferred embodiment accompanied with figures is described in detail below.

DESCRIPTION OF EMBODIMENTS

This disclosure is further explained with the following embodiment, which is not intended to limit the scope of this disclosure. For example, though the illustrated solar cell module for the embodiment includes two solar cells, the solar cell module of this disclosure may alternatively include more than two solar cells.

Figure 1A:
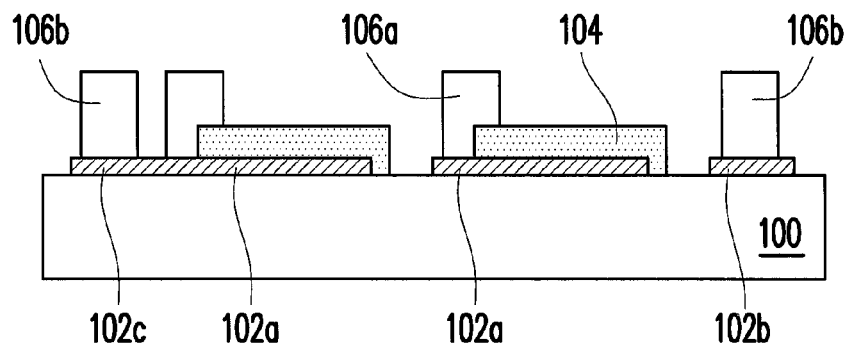
FIGS. 1A-1C illustrate, in a cross-sectional view, a method for fabricating a solar cell module according to an embodiment of this disclosure, wherein FIG. 1C also illustrates the structures of the solar cell module and the solar cells therein.
Figure 1B:
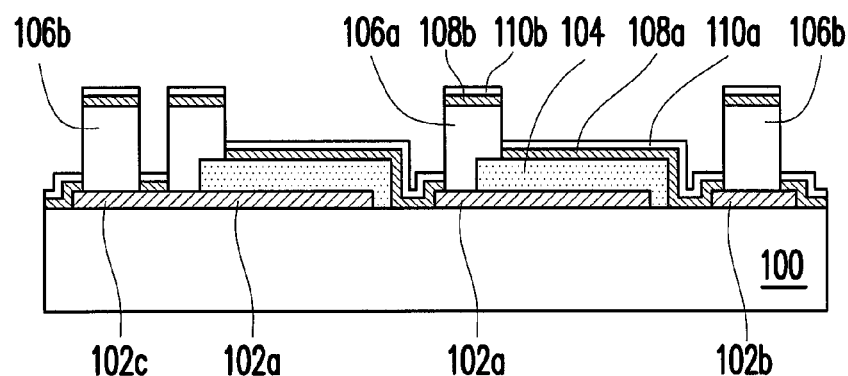
Figure 1C:
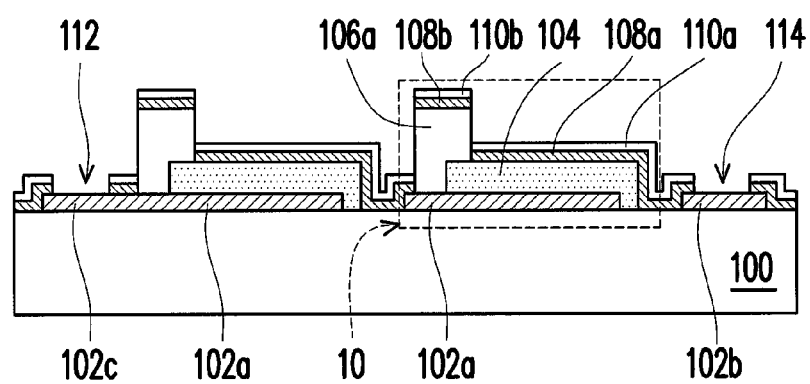

FIGS. 1A-1C illustrate, in a cross-sectional view, a method for fabricating a solar cell module according to an embodiment of this disclosure.

Referring to FIG. 1A, the bottom electrodes 102a of the solar cells in the solar cell module, a contact pad 102b for electrically connecting the top electrode layer (shown later) of a first terminal solar cell to a conductive wire of the solar cell module, and another contact pad 102c for electrically connecting the bottom electrode 102a of a second terminal solar cell to another conductive wire of the solar cell module, are formed on a substrate 100.

In an embodiment, the contact pad 102b for electrically connecting with the top electrode layer of the first terminal solar cell is separated from the bottom electrode 102a of the first terminal solar cell, and the contact pad 102c for electrically connecting with the bottom electrode 102a of the second terminal solar cell is contiguous with the bottom electrode 102a of the second terminal solar cell.

The bottom electrodes 102a and the contact pads 102b and 102c may be formed through a sputtering process and a subsequent patterning process, which may utilize laser scribing or mechanical scribing to pattern the deposited film. The substrate 100 may be a flexible substrate or a non-flexible one. The material of a flexible substrate 100 may be selected from the group consisting of polymers and inorganic materials. Examples of the polymers include polyimide (PI) and polyethylene terephthalate (PET), etc. Examples of the inorganic materials include metal foils such as stainless foil, glass, and flexible glass, etc. The material of the bottom electrodes 102a and the contact pads 102b and 102c may be selected from various conductive materials having sufficiently low resistance, which include metals and conductive materials, etc. Examples of the metals include molybdenum and aluminum, etc. Examples of the conductive materials include transparent conductive oxide materials (TCOs), etc. Examples of the TCOs includes indium tin oxide (ITO), etc.

Referring to FIG. 1A again, a photoelectric conversion layer 104 is formed on each bottom electrode 102a, exposing a first edge of the bottom electrode 102a but cover the sidewall of a second edge of the bottom electrode 102a opposite to the first edge. The photoelectric conversion layer 104 may include silicon, a III-V semiconductor material, copper indium gallium selenide (CIGS), copper indium selenide (CIS), cadmium telluride (CdTe), or an organic photovoltaic (OPV) material. The photoelectric conversion layers 104 may be formed through a deposition process and a subsequent patterning process, which may utilize laser scribing or mechanical scribing to pattern the deposited film.

An insulating pattern 106a is then formed on each bottom electrode 102a, covering an edge portion of the photoelectric conversion layer 104 and exposing a first edge portion of the bottom electrode 102a. Two additional insulating patterns 106b are formed on the contact pads 102b and 102c, respectively.

In an embodiment, the insulating patterns 106a and 106b are sufficiently thick such that each layer deposited later is divided as deposited and hence is not required to pattern. The thickness of the insulating patterns 106a and 106b may range from 1 μm to 30 μm. The insulating patterns 106a and 106b may be formed through screen printing, photolithography or any other suitable patterning method, and may include any suitable insulating material, such as, a polymer resin, or an inorganic insulator material.

Referring to FIG. 1B, a top electrode layer 108a/108b is deposited over the substrate 100, possibly by sputtering. When the insulating patterns 106a/106b are sufficiently thick, the top electrode layer 108a/108b is divided as deposited into the top electrodes 108a of the solar cells and the top electrode layer 108b on the insulating patterns 106a/106b. The top electrode 108a of each solar cell covers the photoelectric conversion layer 104 except for the edge portion thereof covered by the insulating pattern 106a, covers the sidewall of the second edge portion of the bottom electrode 102a of the solar cell opposite to the first edge portion of the same exposed by the corresponding insulating pattern 106a, and is electrically connected with the exposed first edge portion of the bottom electrode 102a of the adjacent solar cell. The top electrode 108a of the terminal solar cell neighboring to the contact pad 102b is connected to the contact pad 102b so that the solar cells connected in series can be electrically connected to a conductive wire of the solar cell module.

The top electrode layer 108a/108b may include one or more materials selected from various conductive materials with sufficiently low resistance. If the bottom electrodes 102a include a non-transparent conductive material, the top electrode layer 108a/108b have to be a transparent layer, which may include a single transparent conductive material or a stack of multiple transparent conductive materials, for the requirement of light passing. Examples of the single transparent conductive material include transparent conductive oxide materials (TCO), such as indium tin oxide (ITO), zinc oxide and aluminum zinc oxide, etc. Examples of the stack of multiple transparent conductive materials include a multilayer conductive film (MTCF), which may include one or more TCOs layers and a metal layer of nano-scale thickness between them.

Then, a passivation layer 110a/110b is deposited over the substrate 100. When the insulating patterns 106a/106b are sufficiently thick, the passivation film 110a/110b is divided as deposited into portions 110a on the top electrodes 108a and portions 110b on the top electrode layer 108b on the insulating patterns 106a/106b. The passivation layer 110a of each solar cell covers the sidewall of the second edge portion of the bottom electrode 102a of the solar cell. The passivation layer may include any suitable insulating material having a passivation effect, such as SiN, $SiO_2$ or $Al_2O_3$.

Referring to FIG. 1C, the insulating patterns 106b formed on the contact pads 102b and 102c are removed to form two openings 112 and 114 in the top electrode layer 108a and the passivation layer 110a exposing the contact pads 102b and 102c, possibly by dipping the above-formed structure in a solvent or by spraying a solvent on the same. The passivation layer 110b and the top electrode layer 108b on the insulating patterns 106a may also be removed from the tops of the insulating patterns 106a.

FIG. 1C also illustrates the structures of the solar cell module according to the above embodiment of this disclosure and the solar cells therein. Each solar cell 10 includes a bottom electrode 102a, an insulating pattern 106a on the bottom electrode 102a, a photoelectric conversion layer 104 on the bottom electrode 102a and having an edge portion covered by the insulating pattern 106a, a top electrode 108a on the photoelectric conversion layer 104 and adjacent to the insulating pattern 106a, and a passivation layer 110a on the top electrode 108a and adjacent to the insulating pattern 106a, wherein the top of the insulating pattern 106a is higher than that of the passivation layer 110a on the top electrode 108a on the photoelectric conversion layer 104. The bottom electrode 102a of a solar cell is electrically connected with the top electrode 108a of the adjacent solar cell, in the manner mentioned above.

Each insulating pattern 106a may be sufficiently thick such that each layer deposited later, i.e., the top electrode layer 108a/108b or the passivation layer 110a/110b, is divided by the insulating patterns 106a/106b as deposited. Thus, each insulating pattern 106a has thereon a top electrode layer 108b and a passivation layer 110b not contiguous with the top electrode layer 108a and the passivation layer 110a on the photoelectric conversion layer 104, if the layers 108b and 110b are not removed from the tops of the insulating patterns 106a after the layers 108a/108b and 110a/110b are formed.

By disposing a sufficiently thick insulating pattern on the bottom electrode of each solar cell, the films deposited later, which include the film for forming the top electrodes, are divided by the insulating patterns as deposited and are not needed to pattern. Thus, the manufacture of the solar cell module is simplified.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A solar cell module, comprising:
   a series of solar cells on a substrate, each comprising:
      a bottom electrode on the substrate;
      a photoelectric conversion layer on the bottom electrode and also on the substrate at a first side of the bottom electrode;
      an insulating pattern on the bottom electrode, covering a first edge portion of the photoelectric conversion layer near a second side of the bottom electrode;
      a top electrode layer on the photoelectric conversion layer and adjacent to the insulating pattern; and
      a passivation layer on the top electrode layer and adjacent to the insulating pattern, wherein a top of the passivation layer on the top electrode layer is lower than a top of the insulating pattern,
      wherein the bottom electrode of a solar cell is electrically connected with the top electrode layer of an adjacent solar cell, and the passivation layer, the top electrode layer, and a second edge portion of the photoelectric conversion layer opposite to the first edge portion cover a sidewall of the bottom electrode.

2. The solar cell module of claim 1, wherein in each solar cell, the insulating pattern is disposed adjacent to an edge portion of the bottom electrode and does not cover the edge portion of the bottom electrode, and the top electrode layer of the adjacent solar cell is electrically connected with the edge portion of the bottom electrode.

3. The solar cell module of claim 1, wherein in each solar cell, the top electrode layer and the passivation layer are also disposed on the insulating pattern, and the top of the insulating pattern is sufficiently high such that the top electrode layer and the passivation layer on the insulating pattern are not contiguous with the top electrode layer and the passivation layer on the photoelectric conversion layer.

4. The solar cell module of claim 3, wherein a thickness of the insulating pattern ranges from 1 µm to 30 µm.

5. The solar cell module of claim 1, wherein the insulating pattern comprises a polymer resin, or an inorganic insulator material.

6. The solar cell module of claim 1, wherein the photoelectric conversion layer comprises silicon, a III-V semiconductor material, CIGS, CIS, CdTe, or an organic photovoltaic (OPV) material.

7. The solar cell module of claim 1, wherein the top electrode layer comprises a multilayer conductive film (MTCF).

8. The solar cell module of claim 1, wherein the substrate is a flexible substrate.

9. A solar cell, comprising:
a bottom electrode on a substrate;
a photoelectric conversion layer on the bottom electrode and also on the substrate at a first side of the bottom electrode;
an insulating pattern on the bottom electrode, covering a first edge portion of the photoelectric conversion layer near a second side of the bottom electrode;
a top electrode layer on the photoelectric conversion layer and adjacent to the insulating pattern; and
a passivation layer on the top electrode layer and adjacent to the insulating pattern, wherein
a top of the insulating pattern is higher than a top of the passivation layer on the top electrode layer, and the passivation layer, the top electrode layer, and a second edge portion of the photoelectric conversion layer opposite to the first edge portion cover a sidewall of the bottom electrode.

10. The solar cell of claim 9, wherein
the top electrode layer and the passivation layer are also disposed on the insulating pattern, and
the top of the insulating pattern is sufficiently high such that the top electrode layer and the passivation layer on the insulating pattern are not contiguous with the top electrode layer and the passivation layer on the photoelectric conversion layer.

11. The solar cell of claim 10, wherein a thickness of the insulating pattern ranges from 1 µm to 30 µm.

12. The solar cell of claim 9, wherein the insulating pattern comprises a polymer resin, or an inorganic insulator material.

13. The solar cell of claim 9, wherein the photoelectric conversion layer comprises silicon, a III-V semiconductor material, CIGS, CIS, CdTe, or an organic photovoltaic (OPV) material.

14. The solar cell of claim 9, wherein the top electrode layer comprises a multilayer conductive film (MTCF).

15. The solar cell of claim 9, wherein the substrate is a flexible substrate.

16. A solar cell, comprising:
a bottom electrode on a substrate;
a photoelectric conversion layer on the bottom electrode and also on the substrate at a first side of the bottom electrode;
an insulating pattern on the bottom electrode, covering an edge portion of the photoelectric conversion layer near a second side of the bottom electrode;
a top electrode layer and a passivation layer on the insulating pattern, wherein
a top of the insulating pattern is sufficiently high such that the top electrode layer and the passivation layer on the insulating pattern are not contiguous with the photoelectric conversion layer wherein the top electrode layer and the passivation layer are also disposed on the photoelectric conversion layer, and the top electrode layer and the passivation layer on the insulating pattern are not contiguous with the top electrode layer and the passivation layer on the photoelectric conversion layer.

17. The solar cell of claim 16, wherein the passivation layer is on the top electrode layer and is adjacent to the insulating pattern, and a top of the passivation layer on the top electrode layer is lower than the top of the insulating pattern.

\* \* \* \* \*